(12) United States Patent
Seo et al.

(10) Patent No.: US 7,741,640 B2
(45) Date of Patent: Jun. 22, 2010

(54) TOP-EMISSION ORGANIC LIGHT-EMITTING DISPLAY DEVICE

(75) Inventors: Chang-Su Seo, Suwon-si (KR); Moon-Hee Park, Busan-si (KR); Tae-Wook Kang, Seongnam-si (KR); Seoung-Yoon Ryu, Seoul (KR); Kwan-Hee Lee, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/075,874

(22) Filed: Mar. 10, 2005

(65) Prior Publication Data

US 2005/0230684 A1    Oct. 20, 2005

(30) Foreign Application Priority Data

Mar. 11, 2004    (KR)    ...................... 10-2004-0016608

(51) Int. Cl.
 *H01L 29/786*    (2006.01)
 *G02F 1/1368*    (2006.01)
(52) U.S. Cl. .............................. 257/59; 257/40; 257/72; 257/88; 257/E51.005; 257/E51.018
(58) Field of Classification Search .................. 257/40, 257/72, E51.024, 59, 88, E51.005, E51.018
 See application file for complete search history.

(56) References Cited

U.S. PATENT DOCUMENTS

| | | | |
|---|---|---|---|
| 6,366,017 B1* | 4/2002 | Antoniadis et al. | 313/506 |
| 6,388,649 B1* | 5/2002 | Tanaka et al. | 345/89 |
| 6,531,713 B1* | 3/2003 | Yamazaki | 257/59 |
| 6,737,800 B1* | 5/2004 | Winters et al. | 313/504 |
| 6,780,688 B2* | 8/2004 | Kim | 438/149 |
| 7,030,553 B2* | 4/2006 | Winters et al. | 313/504 |
| 7,166,959 B2* | 1/2007 | Suzuki et al. | 313/504 |
| 2003/0156239 A1* | 8/2003 | Inoue et al. | 349/113 |
| 2003/0234608 A1* | 12/2003 | Lee et al. | 313/504 |
| 2004/0004434 A1* | 1/2004 | Nishi et al. | 313/506 |
| 2004/0027055 A1* | 2/2004 | Yamazaki et al. | 313/498 |
| 2004/0079941 A1* | 4/2004 | Yamazaki et al. | 257/40 |
| 2004/0135148 A1* | 7/2004 | Lin | 257/72 |
| 2004/0178725 A1* | 9/2004 | Karasawa et al. | 313/506 |

(Continued)

FOREIGN PATENT DOCUMENTS

CN    1432854    7/2003

(Continued)

*Primary Examiner*—Anh D Mai
(74) *Attorney, Agent, or Firm*—H.C. Park & Associates, PLC (57) ABSTRACT

An organic light-emitting display device and a method of fabricating the device are disclosed. The organic light-emitting display device includes a thin-film transistor positioned on a substrate that has a semiconductor layer, a gate electrode, and source and drain electrodes. A first electrode is positioned, which is connected to either the source electrode or drain electrode. A reflective layer, which is spaced apart from the source electrode or drain electrode, is positioned below the first electrode. An organic functional layer having at least an emission layer is positioned on the first electrode. A second electrode is positioned on the organic functional layer. The first electrode, the reflective layer, the organic functional layer, and the second electrode constitute an organic light-emitting diode.

17 Claims, 11 Drawing Sheets

U.S. PATENT DOCUMENTS

| | | | |
|---|---|---|---|
| 2004/0241931 A1* | 12/2004 | Akimoto et al. | 438/220 |
| 2004/0251466 A1* | 12/2004 | Nakamura | 257/79 |
| 2004/0256979 A1* | 12/2004 | Murakami et al. | 313/503 |
| 2005/0082532 A1* | 4/2005 | Murakami et al. | 257/72 |
| 2008/0158459 A1* | 7/2008 | Lee et al. | 349/43 |

FOREIGN PATENT DOCUMENTS

| | | | |
|---|---|---|---|
| CN | 1499903 | | 5/2004 |
| JP | 2001-195014 | | 7/2001 |
| JP | 2003-043953 | | 2/2003 |
| JP | 2003-178882 | | 6/2003 |
| JP | 2003-202587 | * | 7/2003 |
| JP | 2005-197011 | | 7/2005 |
| JP | 2005-209413 | | 8/2005 |

* cited by examiner

TOP-EMISSION ORGANIC LIGHT-EMITTING DISPLAY DEVICE

CROSS-REFERENCE TO RELATED APPLICATION

This application claims priority to and the benefit of Korean Patent Application No. 2004-16608, filed Mar. 11, 2004, the disclosure of which is incorporated herein by reference in its entirety.

BACKGROUND OF THE INVENTION

1. Field of the Invention

The present invention relates to a top-emission organic light-emitting display device in which the source or drain electrode of a thin-film transistor is in direct contact with a transparent electrode and a reflective layer is formed below the transparent electrode to be spaced from the source electrode and drain electrode.

2. Description of the Related Art

Typically, an organic light-emitting display (OLED) device has advantages over other flat panel displays in that it has a broader range of operable temperature, is stronger against impact or vibration, has a wider viewing angle, and has a faster response speed to provide clear moving pictures. Accordingly, the organic light-emitting display device attracts attention as a next-generation flat panel display device.

The organic light-emitting display device includes an anode, an organic emission layer positioned on the anode, and a cathode positioned on the organic emission layer. In the organic light-emitting display device, when a voltage is applied between the anode and the cathode, holes are injected from the anode into the organic emission layer and electrons are injected from the cathode into the organic emission layer. The holes and the electrons, which are injected into the organic emission layer, are combined in the organic emission layer to create excitons. These excitons emit light while transitioning from an excitation state to a base state.

This organic light-emitting display device may be classified according to the position of a reflective layer. For example, in a bottom-emission organic light-emitting display device the light generated by the above-stated phenomenon is emitted downward from the substrate, and in a top-emission organic light-emitting display device the light is emitted upward from the substrate. Further, it may be further classified according to a driving manner where a passive matrix organic light-emitting display device needs a separate driving source and an active matrix organic light-emitting display device uses thin-film transistors as the active elements.

Figure 1:
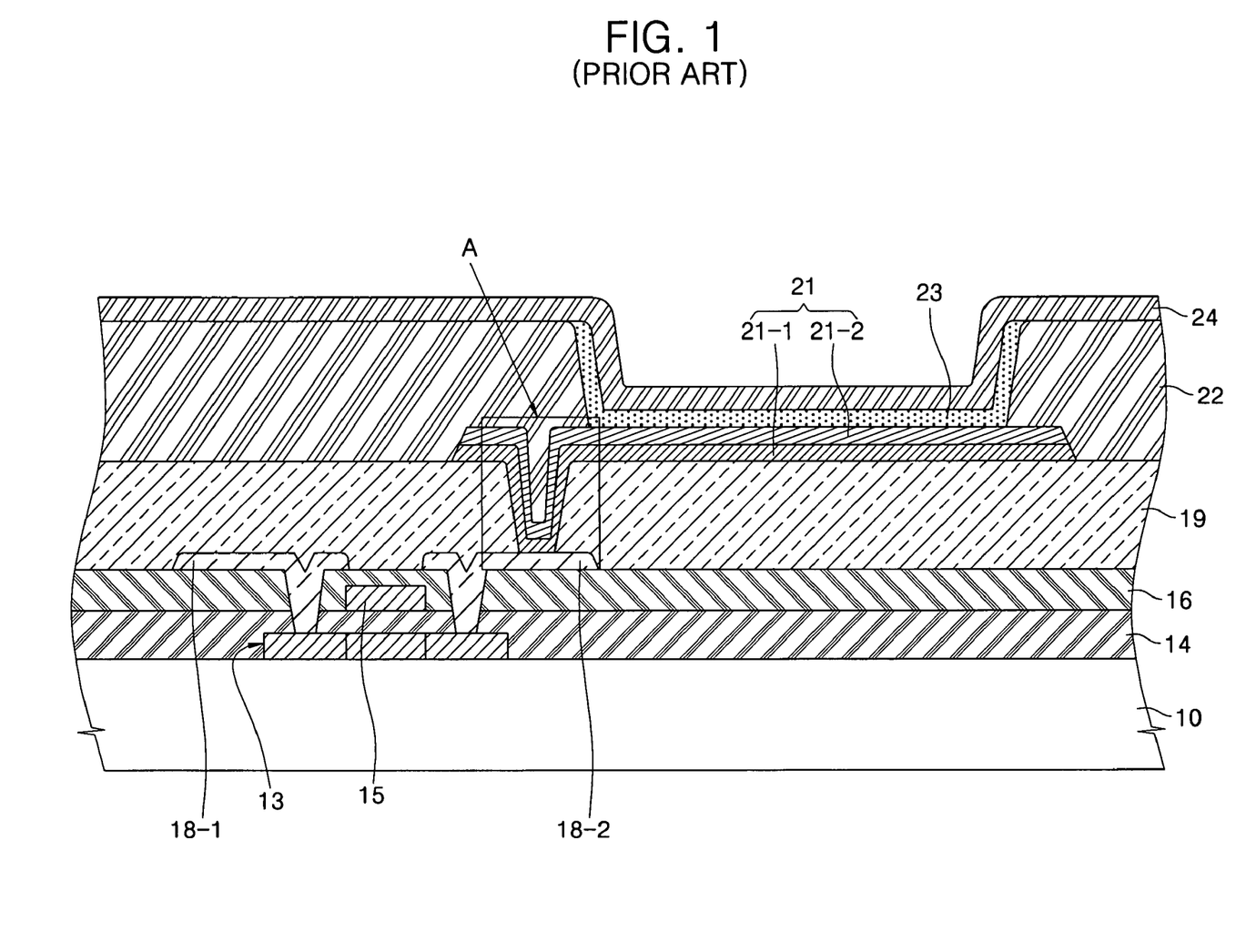
FIG. 1 is a cross-sectional view of a top-emission organic light-emitting display device according to prior art.

FIG. 1 is a cross-sectional view of a conventional top-emission active matrix organic light-emitting display device. Referring to FIG. 1, in the top-emission organic light-emitting display device, a thin-film transistor having a semiconductor layer 13, a gate electrode 15, a source electrode 18-1, and a drain electrode 18-2 are formed in a non-emission region on a substrate 10 by semiconductor processes. An organic light-emitting diode having a first electrode 21, an organic functional layer 23 and a second electrode 24 are formed in an emission region. A gate insulating layer 14, an interlayer insulating layer 16, a passivation layer 19 and a pixel defining layer 22 are further formed to insulate the conductive layers from one another.

Here, the first electrode 21 is a reflective electrode, and is preferably a conductive layer with an optical reflective property and a proper work function. However, because there is no proper single material that simultaneously meets these properties up to now, it is common to make the reflective electrode as a multilayer structure in which an aluminum layer 21-1 having excellent reflective efficiency is formed and an indium tin oxide (ITO) layer 21-2 having a high work function is formed thereon.

Figure 2:
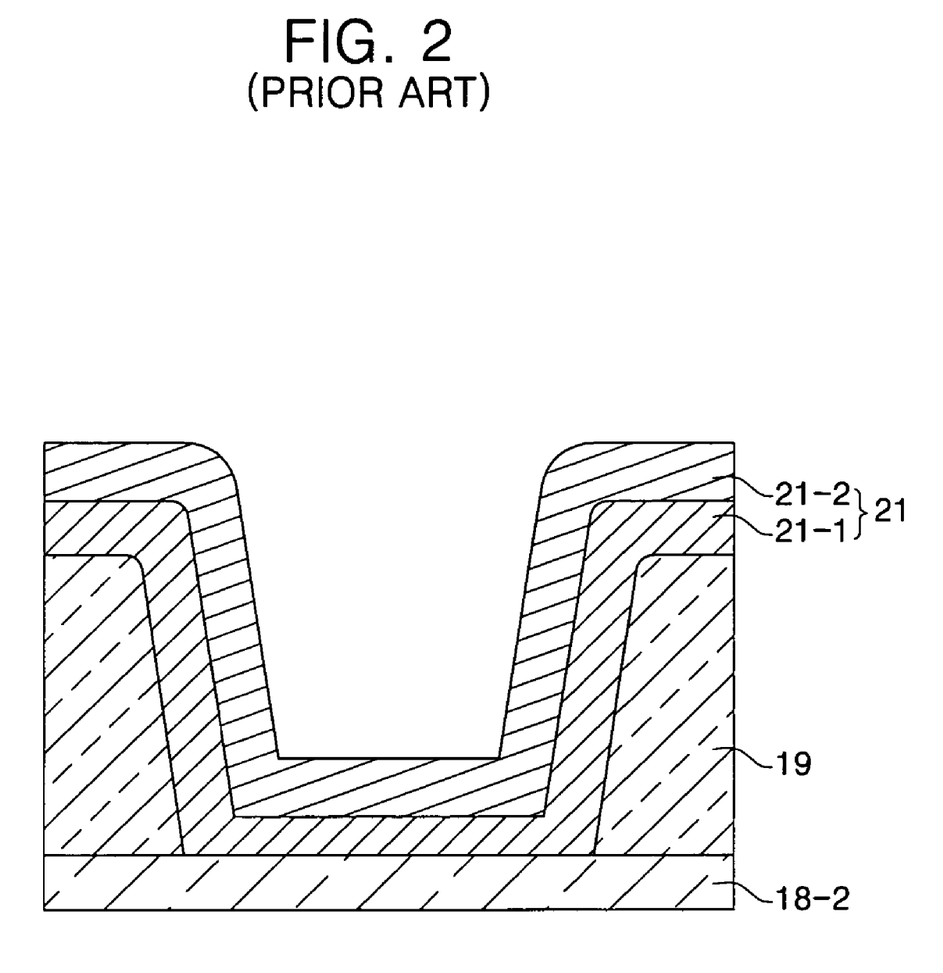
FIG. 2 is an enlarged cross-sectional view of the region A in FIG. 1.

FIG. 2 is an enlarged cross-sectional view of the region A of the FIG. 1.

Referring to FIG. 2, when a reflective electrode employs a multilayer structure as described above, galvanic corrosion may occur between the aluminum layer 21-1 and the ITO layer 21-2 upon using an etching solution to pattern the reflective electrode. Moreover, the galvanic corrosion may diffuse along an interlayer interface between the aluminum layer 21-1 and the ITO layer 21-2.

Further, an aluminum oxide layer may be formed due to the interaction of aluminum and ITO between the aluminum layer 21-1 and the ITO layer 21-2. The aluminum oxide layer increases resistance between the drain electrode 18-2 and the ITO layer 21-2, such that the contact resistance between the first electrode 21 and the drain electrode 18-2 increases and dispersion of the contact resistance in the substrate increases. The increase in the dispersion of the contact resistance in the substrate causes non-uniformity in brightness between pixels when operating the top-emission organic light-emitting display device, thereby greatly degrading the quality of a screen.

SUMMARY OF THE INVENTION

The present invention, therefore, solves aforementioned problems associated with conventional devices by providing a top-emission organic light-emitting display device. The invention also provides a method of fabricating the device that is capable of improving non-uniformity in brightness between pixels that is caused due to unstable contact resistance in an interface between a transparent electrode layer and a reflective layer, which constitute a reflective electrode.

Additional features of the invention will be set forth in the description which follows, and in part will be apparent from the description, or may be learned by practice of the invention.

The present invention discloses an organic light-emitting display device including a thin-film transistor positioned on a substrate and has a semiconductor layer, a gate electrode, a source electrode and a drain electrode. A first electrode is positioned to connect either the source or the drain electrode. A reflective layer is positioned under the first electrode and is spaced apart from the source and the drain electrodes. An organic functional layer is positioned on the first electrode and has at least an emission layer. A second electrode is positioned on the organic functional layer. The first electrode, the reflective layer, the organic functional layer, and the second electrode constitute an organic light-emitting diode.

The present invention also discloses an organic light-emitting display device including a thin-film transistor positioned on a substrate that has a semiconductor layer, a gate electrode, a source electrode and a drain electrode. An electrode pad is placed in contact with either the source or the drain electrode. A first electrode is positioned on and in contact with the electrode pad. A reflective layer is interposed between the electrode pad and the first electrode. An organic functional layer is positioned on the first electrode, and has at least an emission layer. A second electrode is positioned on the organic functional layer.

The present invention also discloses a method for fabricating an organic light-emitting display device that includes forming a thin-film transistor that includes a semiconductor layer, a gate electrode, a source electrode and a drain electrode on a substrate. In addition, a reflective layer is formed so that it is spaced apart from the source and the drain electrodes. A first electrode is formed on the reflective layer so that the first electrode electrically connects with either the source electrode or the drain electrodes. An organic functional layer that has at least an emission layer is formed on the first electrode, and a second electrode is formed on the organic functional layer.

It is to be understood that both the foregoing general description and the following detailed description are exemplary and explanatory and are intended to provide further explanation of the invention as claimed.

BRIEF DESCRIPTION OF THE DRAWINGS

The above and other features of the present invention will be described in reference to certain exemplary embodiments thereof with reference to the attached drawings.

DETAILED DESCRIPTION

Hereinafter, illustrated embodiments of the present invention will be described in detail with reference to the accompanying drawings. In the respective drawings, the length and thickness of layers and regions may be exaggerated for convenience. Throughout this disclosure, the same reference numerals indicate the same components.

Figure 3A:
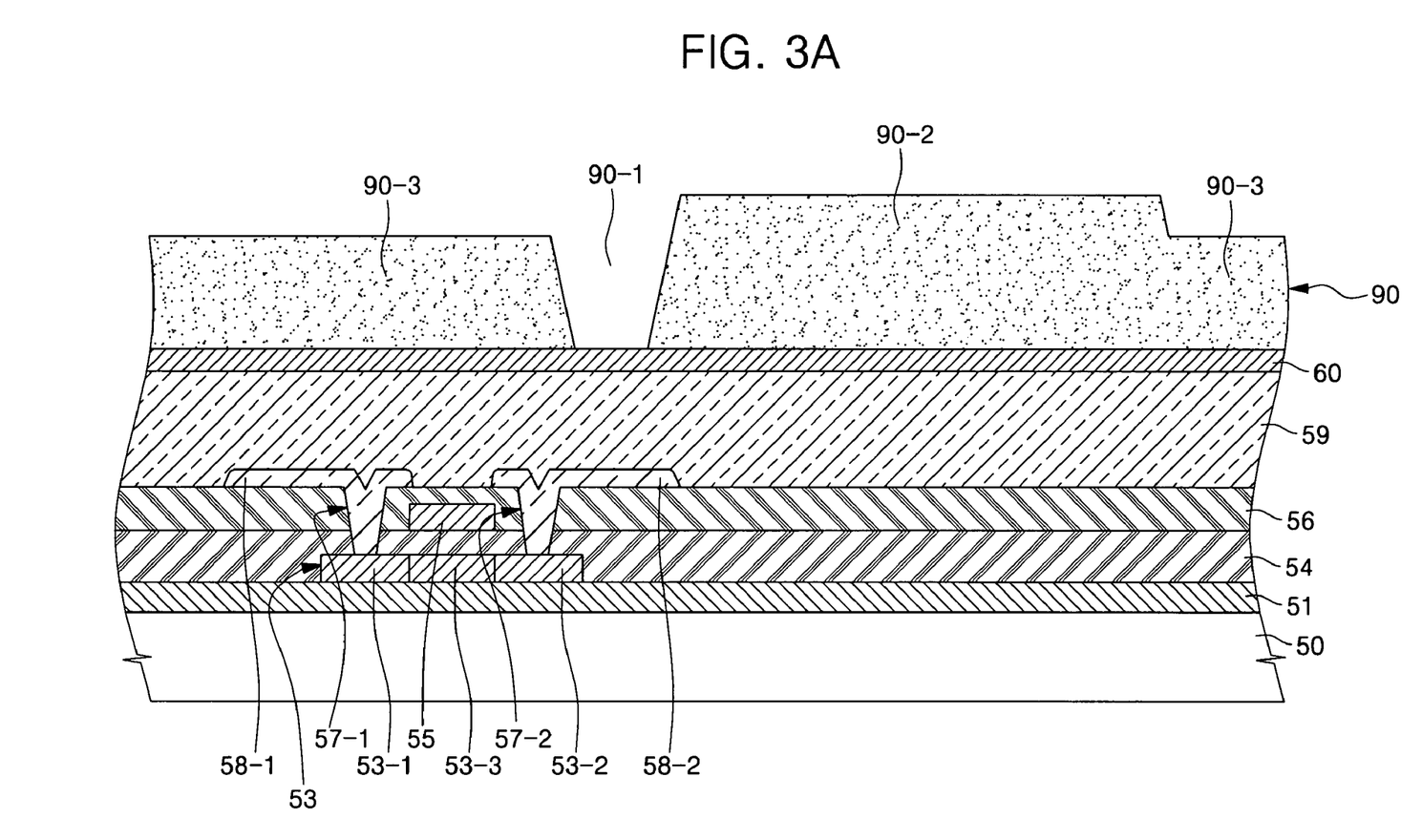
FIG. 3A, FIG. 3B and FIG. 3C are cross-sectional views illustrating a top-emission organic light-emitting display device and method of fabricating the device according to an exemplary embodiment of the present invention.
Figure 3B:
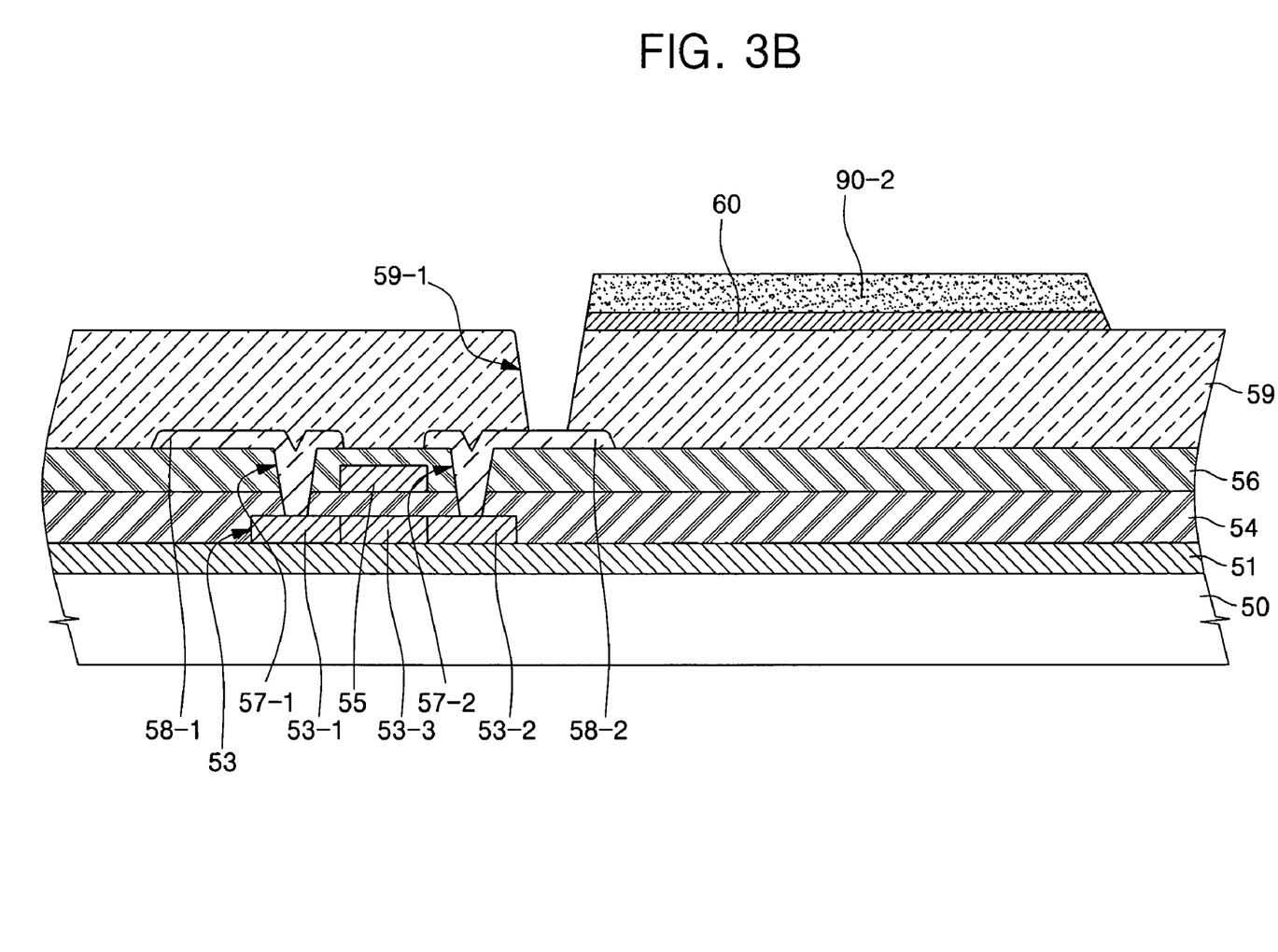
Figure 3C:
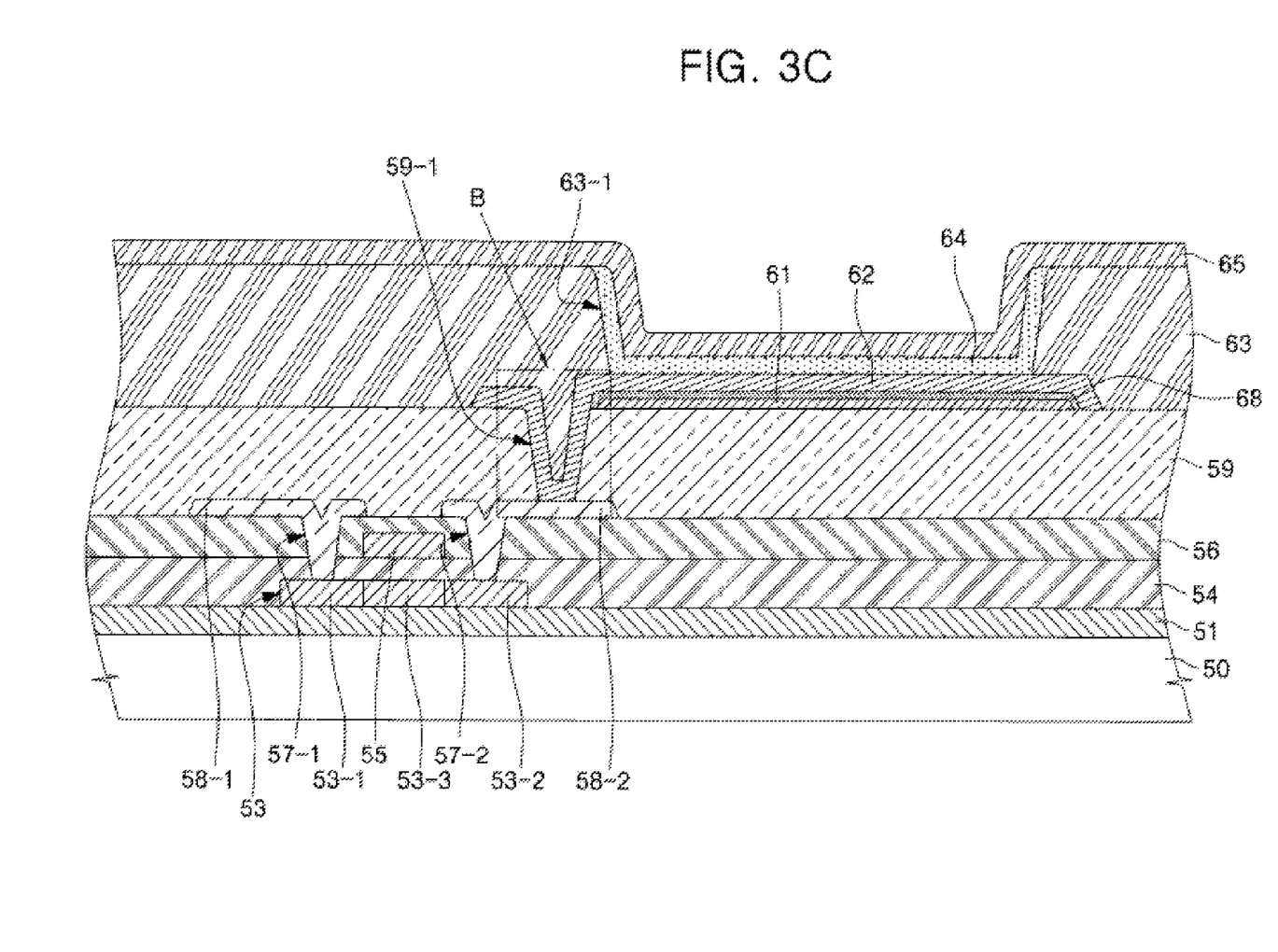

FIG. 3A, FIG. 3B and FIG. 3C are cross-sectional views illustrating a top-emission organic light-emitting display device and a method of fabricating the device according to an exemplary embodiment of the present invention.

Referring to FIG. 3A, an insulating substrate 50, such as a glass substrate or a synthetic resin, is prepared. Subsequently, a buffer layer (i.e. diffusion barrier) 51 is formed by a plasma enhanced chemical vapor deposition (PECVD) method, a low pressure chemical vapor deposition (LPCVD) method, a sputtering method, or the like to prevent impurities such as metal ions from diffusing from the insulating substrate 50 and penetrating into a semiconductor layer (i.e., polycrystalline silicon) described below.

An amorphous silicon (amorphous Si) layer is deposited on the buffer layer 51 using a PECVD method, an LPCVD method, a sputtering method, or the like. The deposited amorphous silicon is crystallized to form a polycrystalline silicon (poly-Si) layer using a crystallization process such as a solid phase crystallization (SPC) method, an excimer laser annealing (ELA) method, a sequential lateral solidification (SLS) method, a metal induced crystallization (MIC) method, or a metal induced lateral crystallization (MILC) method. Subsequently, a photoresist pattern is formed on the poly-Si layer, and then the poly-Si layer is etched using the photoresist pattern as a mask to form a semiconductor layer 53. Subsequently, a gate insulating layer 54 is formed on the semiconductor layer 53. A gate conductive layer is deposited on the gate insulating layer 54 and then is patterned to form a gate electrode 55 on the gate insulating layer 54.

Next, n-type or p-type impurity ions are injected into the semiconductor layer 53 to form a source region 53-1 and a drain region 53-2 in the semiconductor layer 53 corresponding to both sides of the gate electrode 55. By doing so, a region between the source and drain regions 53-1 and 53-2 is defined as a channel region 53-3.

Subsequently, an interlayer insulating layer 56 is formed on the gate electrode 55 and the gate insulating layer 54. Selected regions of the interlayer insulating layer 56 are etched to form contact holes 57-1 and 57-2 that expose predetermined regions of the source and the drain regions 53-1 and 53-2, respectively.

A conductive material is then deposited over the entire surface of the substrate 50 including the contact holes 57-1 and 57-2 and is patterned to form a source electrode 58-1 and a drain electrode 58-2. At this time, the source and the drain electrodes 58-1 and 58-2 are in electrical contact with the source and the drain regions 53-1 and 53-2 through the contact holes 57-1 and 57-2, respectively. The conductive material that forms the source and the drain electrodes 58-1 and 58-2 may be molybdenum (Mo) or preferably a molybdenum-tungsten alloy (MoW) that may form an ohmic contact with a transparent electrode to be formed in the following process. The semiconductor layer 53, the gate electrode 55, the source electrode 58-1 and the drain electrodes 58-2 constitute the thin-film transistor.

Subsequently, a passivation layer 59 is formed over the entire surface of the substrate 50 including the source and the drain electrodes 58-1 and 58-2. The passivation layer 59 is formed of only an inorganic insulating layer or an organic planarization layer, or formed in a two-layered structure thereof. The two-layered structure may have an organic planarization layer deposited on the inorganic insulating layer. The inorganic insulating layer may be a silicon nitride ($SiN_x$) or silicon oxide ($SiO_2$) layer, and the organic planarization layer may be a thermosetting resin layer such as an acrylic resin, benzocyclobutene (BCB), or the like.

A reflective material layer 60 with excellent reflection properties is deposited on the passivation layer 59. The reflective material layer may be an aluminum (Al) layer, an aluminum alloy layer or, preferably, an aluminum-neodymium (Al—Nd) layer having excellent reflective efficiency. Further, the reflective material layer 60 is formed by a typical method such as an RF sputtering method, a DC sputtering method, an ion beam sputtering method, a vacuum deposition method, or the like.

A photoresist pattern 90 having an opening 90-1, a first thickness portion 90-2, and a second thickness portion 90-3 thinner than the first thickness portion 90-2 is formed on the deposited reflective material layer 60 using a halftone photomask.

Referring to FIG. 3B, the exposed reflective material layer 60 in the opening (90-1 of FIG. 3A) and the underlying passivation layer (59 of FIG. 3A) are etched using the photoresist pattern 90 as a mask. As a result, a via hole 59-1 corresponding to the opening (90-1 of FIG. 3A) is formed exposing the drain electrode 58-2. But, the via hole 59-1 may be formed to expose the source electrode 58-1 rather than the drain electrode 58-2. In that process, the second thickness portion (90-3 of FIG. 3A) is all etched, and the reflective material layer 60 below it (90-3 of FIG. 3A) is also etched. However, only the upper portion of the first thickness portion (90-2 of FIG. 3A) is etched preventing the underlying reflective material layer 60 from being exposed since there is a difference between the second thickness portion (90-3 of FIG. 3A) and the first thickness portion (90-2 of FIG. 3A).

Referring to FIG. 3C, the remaining first thickness portion (90-2 of FIG. 3B) is removed. As a result, a reflective layer 61 corresponding to the first thickness portion (90-2 of FIG. 3B) is formed. The reflective layer 61 is positioned to be spaced apart from the exposed drain electrode 58-2 and the source electrode 58-1. Preferably, the reflective layer 61 is formed in an emission region. Further, the source and the drain electrodes 58-1 and 58-2 and the reflective layer 61 are positioned in different layers from each other due to the passivation layer 59. By forming the via hole 59-1 and the reflective layer 61 using only one halftone photomask as described above, manufacturing cost may be reduced. Meanwhile, the reflective layer 61 may be about 100 Å to about 2000 Å thick to show a proper reflective characteristic.

Alternatively, before forming the reflective material layer (60 of FIG. 3A), a selected region of the passivation layer 59 may be etched to form a via hole 59-1 that exposes either the source or drain electrodes 58-1 and 58-2. In this case, when the passivation layer 59 has a two-layered structure, an inorganic insulating layer is formed and then a first contact hole is formed, and an organic planarization layer is formed thereon and then a second contact hole, which is connected to the formed first contact hole, is formed. The first contact hole and the second contact hole form the via hole 59-1.

Subsequently, a reflective material layer is formed over the entire surface of the passivation layer 59 and is patterned by etching to form a reflective layer 61. As a result, the source electrode 58-1 or the drain electrodes 58-2 is exposed in the via hole 59-1, and the reflective layer 61 is formed on the passivation layer 59 except for the via hole 59-1 region. When patterning the reflective material layer, it is preferable to use a dry etching process that allows anisotropic etching, rather than a wet etching process. Possible dry etching process may include, but are not limited to an ion beam etching method, an RF sputtering etching method, a reaction ion etching (RIE) method, and the like. The dry etching process may be properly performed by those skilled in the art.

Next, a transparent conductive layer is deposited in the via hole 59-1 and on the reflective layer 61. Specifically, the transparent conductive layer is formed by a typical sputtering or vacuum deposition method. The transparent conductive layer is patterned to form a is first electrode 62. Patterning the transparent conductive layer may be performed using typical photolithography and etching processes. The etching process may be one of the wet and dry etching processes. As a result, the first electrode 62 is connected to the exposed drain electrode 58-2 through the via hole 59-1, and the reflective layer 61 is positioned below the first electrode 62. The transparent conductive layer may be an ITO or (Indium Zinc Oxide) IZO layer. Further, the first electrode 62 may be about 50 Å to about 700 Å thick in consideration of a function as an electrode and several aspects.

In this exemplary embodiment, the reflective layer 61 serves only to reflect light. Moreover, the first electrode 62 is in direct contact with the drain electrode 58-2 to minimize contact resistance between them. Further, the reflective layer 61 and the first electrode 62 are formed by respective etching processes so that galvanic corrosion occurring in the interface between the reflective layer 61 and the first electrode 62 may be prevented.

Subsequently, a pixel defining layer 63 having an opening 63-1 that exposes at least a portion of the first electrode 62 is formed on the first electrode 62, and an organic functional layer 64 having at least an emission layer is formed on the exposed first electrode 62. The organic functional layer 64 may further include for example, at least a hole injection layer, a hole transport layer, a hole blocking layer, an electron transport layer or an electron injection layer for high luminous efficiency. A second electrode 65 is formed on the organic functional layer 64. The reflective layer 61, the first electrode 62, the organic functional layer 64 and the second electrode 65 constitute an organic light-emitting diode.

When the first electrode 62 acts as an anode electrode, the second electrode 65 acts as a cathode electrode. In that situation, it is preferable that the hole injection layer and the hole transport layer are positioned between the first electrode 62 and the emission layer, and the hole blocking layer, the electron transport layer and the electron injection layer are positioned between the emission layer and the second electrode 65. Such a formation of the organic functional layer 64 is performed by a wet coating method such as spin coating where the coating is in a solution state, deep coating, a spray method, screen printing, inkjet printing, or the like. Alternatively, the organic functional layer 64 may be formed by a dry coating method such as sputtering, vacuum deposition, or the like.

The emission layer is a layer that emits light of a specific wavelength by itself based on recombination of electrons and holes injected from the cathode and the anode. The emission layer emits red, green, and blue light through current flow. The emitted light is reflected by the reflective layer 61, which is positioned below the first electrode 62, and is emitted upward.

It is preferable that the second electrode 65 is formed as a transmission electrode layer so that the light emitted by the underlying organic functional layer 64 is transmitted. It is preferable that the second electrode 65 is formed of a transparent conductive layer such as ITO, IZO or the like, or of a metal such as Mg, Ca, Al, Ag, or Ba or an alloy thereof. The second electrode 65 is formed to a thickness sufficient to transmit light.

Finally, the thin-film transistor and the organic light-emitting diode are encapsulated by typical encapsulating means. For example, the encapsulating means may be an insulating substrate of a metal can, barium oxide or the like, or an insulating polymer.

Figure 4:
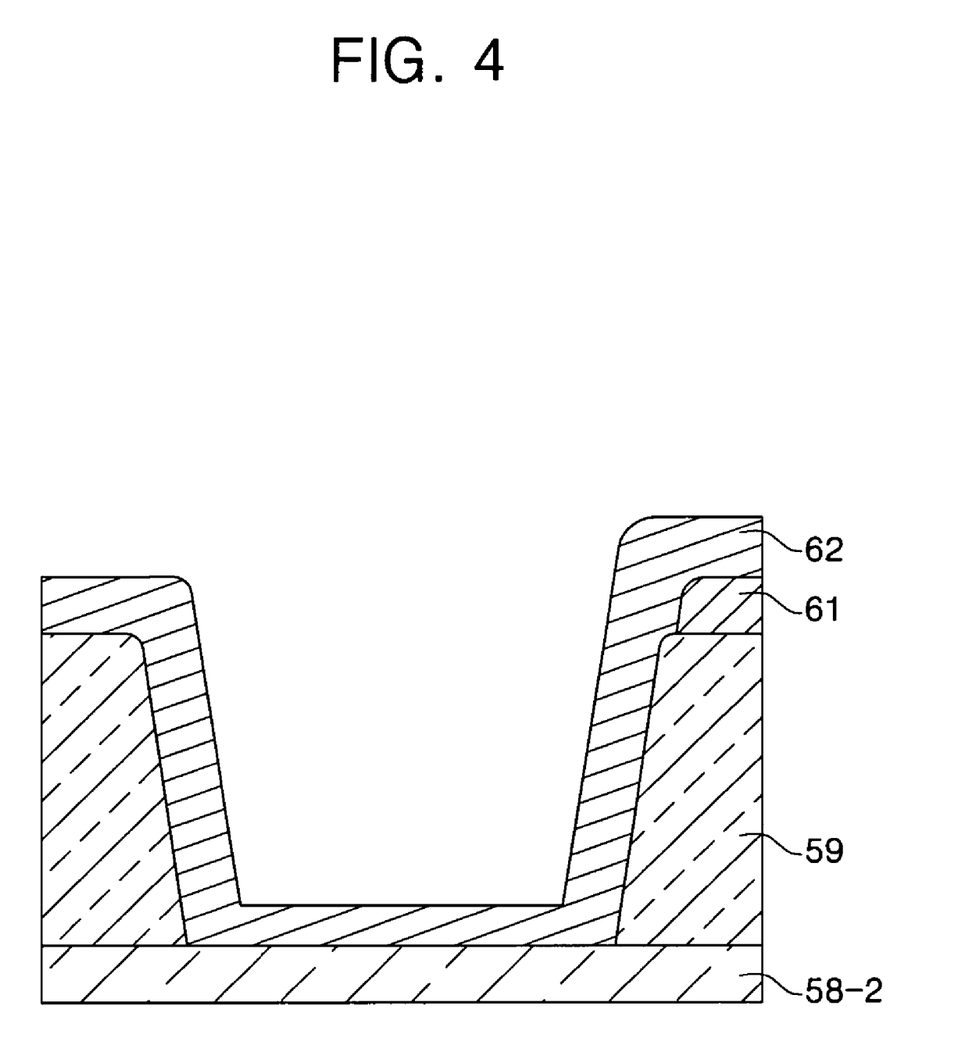
FIG. 4 is an enlarged cross-sectional view of the region B in FIG. 3B.

FIG. 4 is an enlarged cross-sectional view of region B in FIG. 3C. It shows that a reflective layer 61 is not in contact with a drain electrode 58-2, and a first electrode 62 is in contact with the drain electrode 58-2. The first electrode 62 is a transparent conductive layer and has a higher work function than the reflective layer 61 and is made of either ITO or IZO. The transparent conductive layer may be in ohmic contact with molybdenum or an alloy thereof that is also present in the drain electrode 58-2, so that in operating the display device, current is uniformly delivered from the drain electrode 58-2 to the first electrode 62. As a result, the contact resistance between the drain electrode 58-2 and the first electrode 62 is reduced making brightness between pixels of the organic light-emitting display device more uniform.

Further, as the applied current is directly delivered to the first electrode 62 and the reflective layer 61 only reflects light rather than functioning as an electrode, it is possible to prevent the contact resistance from increasing due to an oxide layer 68 created in the interface between the reflective layer 61 and the first electrode 62. Further, because the reflective efficiency increases, it is possible to realize pictures having high quality. In addition, the transparent conductive layer constituting the first electrode 62 has excellent coverage and thus is formed to encompass an edge of the reflective layer 61. Upon forming an opening 63-1 in the pixel defining layer 63, the transparent conductive layer may prevent the edge of the reflective layer 61 of metal from being corroded by strong acid or strong base.

Figure 5:
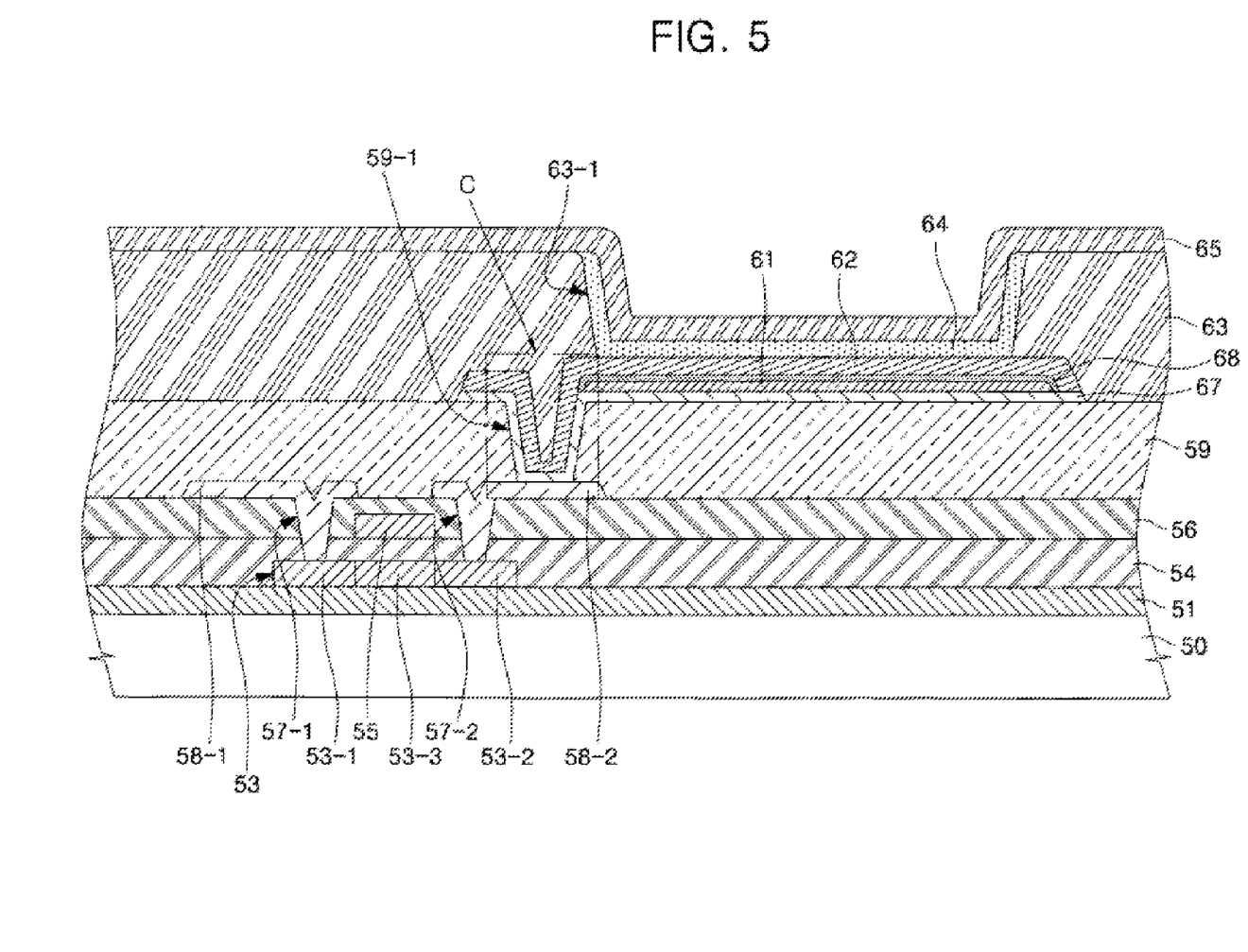
FIG. 5 is a cross-sectional view of an organic light-emitting display device according to another exemplary embodiment of the present invention.

FIG. 5 is a cross-sectional view illustrating an organic light-emitting display device and method of fabricating the same according to another embodiment of the present invention. The organic light-emitting display device according to this embodiment may be identical to the organic light-emitting display device shown in FIG. 3C except for the differences described below. Moreover, in FIG. 5, the same reference numerals as in FIG. 3C indicate the same components.

Referring to FIG. 5, a passivation layer 59 is formed over the entire surface of a substrate 50 including source and drain electrodes 58-1 and 58-2. A via hole 59-1 is formed that exposes one of the source and the drain electrodes 58-1 and 58-2 by etching a selected region of the passivation layer 59. When the passivation layer 59 is formed in a two-layered structure, an inorganic insulating layer, a first contact hole, an organic planarization layer, and then a second contact hole, which is connected to the formed first contact hole, are all formed. The first contact hole and the second contact hole form the via hole 59-1.

Subsequently, an electrode pad material layer is formed over the entire surface of the passivation layer 59, and is patterned to form an electrode pad 67. The electrode pad 67 is in contact with the drain electrode 58-2 through the via hole 59-1. The electrode pad 67 may be an ITO or IZO layer.

A reflective material layer is formed on the electrode pad 67, and is patterned to form a reflective layer 61. In patterning the reflective material layer, the reflective material layer that is formed on a region where the electrode pad 67 is in contact with the drain electrode 58-2 is etched. As a result, the region where the electrode pad 67 is in contact with the drain electrode 58-2 is exposed. Preferably, the reflective layer 61 is formed in an emission region. In patterning the reflective material layer, it is preferable to use a dry etching process that allows anisotropic etching, rather than a wet etching process. Several methods such as ion beam etching, RF sputtering etching, reactive ion etching (RIE) or the like may be used as the dry etching process. The dry etching process may be properly performed by those skilled in the art.

Subsequently, a transparent conductive layer is deposited on the exposed electrode pad 67 and reflective layer 61. Specifically, the transparent conductive layer is formed by a typical sputtering or vacuum deposition method. The transparent conductive layer is patterned to form a first electrode 62. Patterning the transparent conductive layer is made by successively performing typical photolithography and etching processes, in which any one of the wet and dry etching processes is properly selected and used as the etching process.

As a result, the first electrode 62 is in contact with the exposed electrode pad 67. Specifically, the exposed electrode pad 67 is interposed between the drain electrode 58-2 and the first electrode 62, and the first electrode is electrically connected to the drain electrode 58-2 through the electrode pad 67. Further, the reflective layer 61 is interposed between the electrode pad 67 and the first electrode 62. In this exemplary embodiment, the reflective layer 61 serves only to reflect light. Moreover, the first electrode 62 is electrically connected to the drain electrode 58-2 through the electrode pad 67, so that contact resistance between the first electrode 62 and the drain electrode 58-2 is reduced. Further, the reflective layer 61 and the first electrode 62 are formed by etching processes, such that a corrosion phenomenon is prevented which may occur in the interface between the reflective layer 61 and the first electrode 62.

Figure 6:
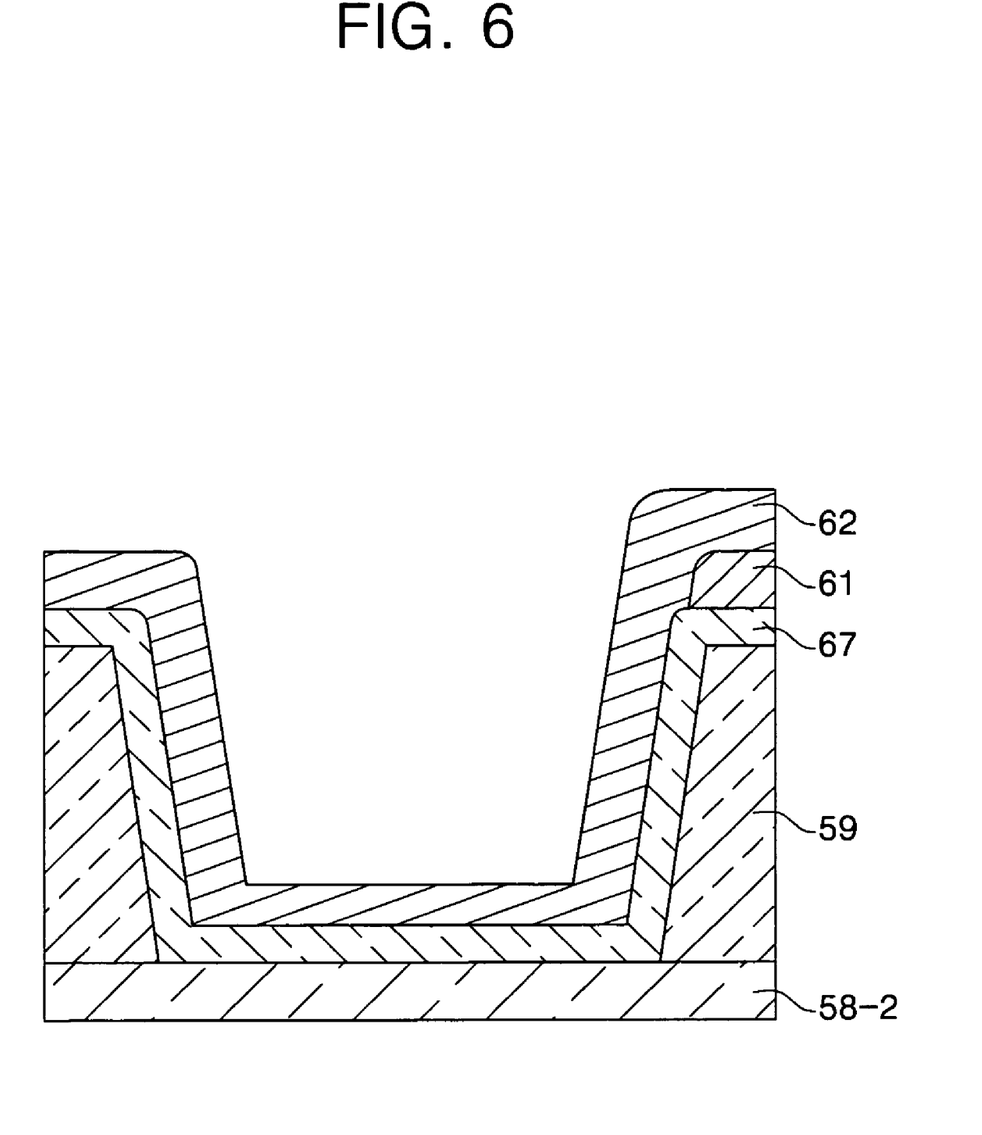
FIG. 6 is an enlarged cross-sectional view of the region C in FIG. 5.

FIG. 6 is an enlarged cross-sectional view of the region C in FIG. 5. A reflective layer 61 is not in contact with a drain electrode 58-2. However, an electrode pad 67 is in contact with the drain electrode 58-2 and a first electrode 62 is in contact with the electrode pad 67 to electrically connect to the drain electrode 58-2. The electrode pad 67 may be an ITO layer or an IZO layer. This layer may be in ohmic contact with molybdenum or its alloy which also present in the drain electrode 58-2. Further, the first electrode 62 may be an ITO layer or an IZO layer. Accordingly, contact resistance between the electrode pad 67 and the first electrode 62, which are formed of a similar material, may be ignored. In operating the display device, current may be uniformly delivered from the drain electrode 58-2 to the first electrode 62. As a result, the contact resistance between the drain electrode 58-2 and the first electrode 62 is reduced making the brightness between pixels of an organic light-emitting display device more uniform.

Further, as the applied current is directly delivered to the first electrode 62 and the reflective layer 61 only reflects the light rather than a functioning as an electrode, it is possible to prevent the contact resistance from increasing due to an oxide layer 68 created in the interface between the reflective layer 61 and the first electrode 62. Further, because the reflective efficiency increases, it is possible to realize pictures of a high quality. In addition, a transparent conductive layer constituting the first electrode 62 has excellent coverage and thus is formed to encompass an edge of the reflective layer 61. By doing so, when an opening 63-1 is formed in a pixel defining layer 63, it is possible to suppress that strong acid or strong base from corroding the edge of the reflective layer 61 of metal.

Figure 7:
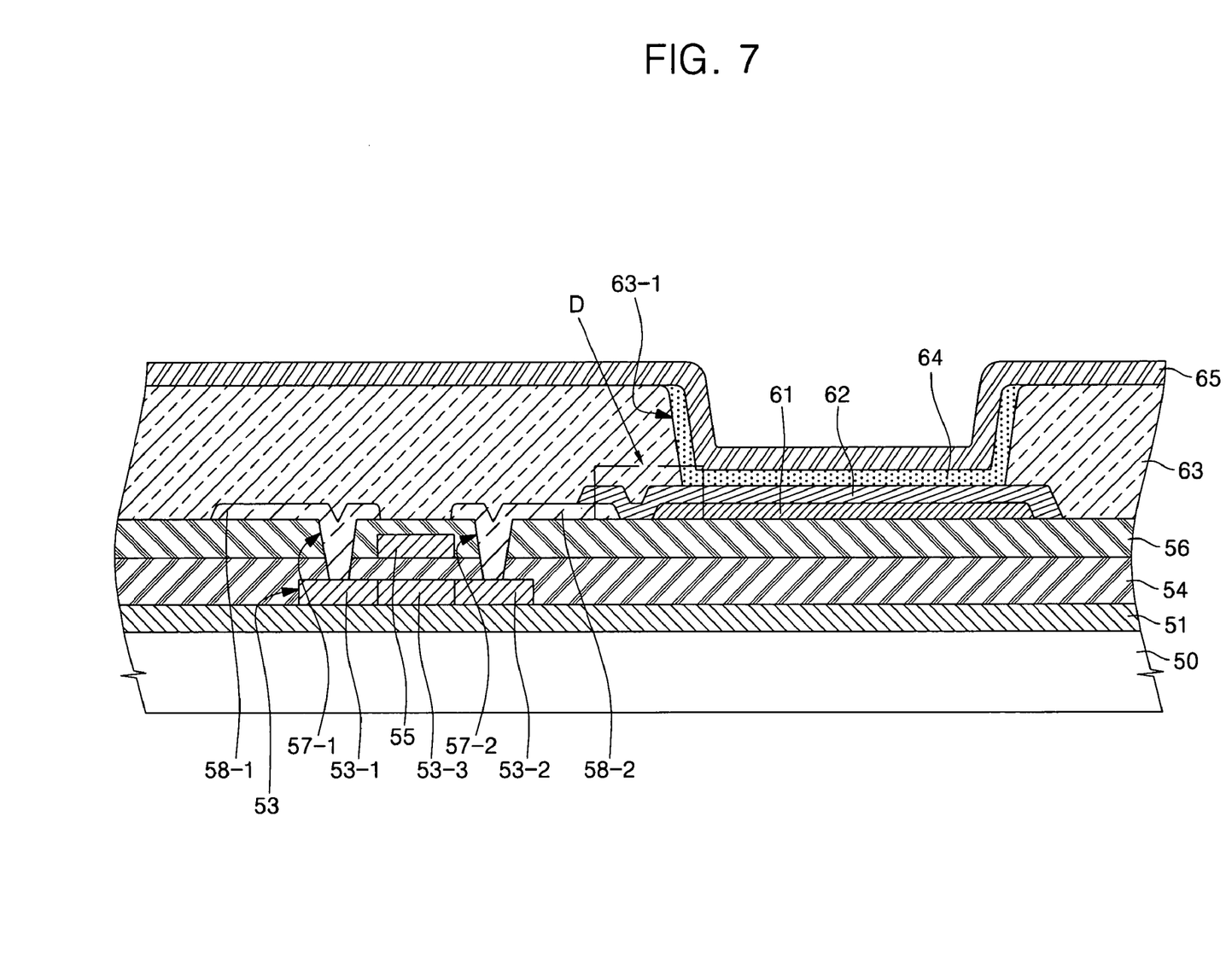
FIG. 7 is a cross-sectional view of an organic light-emitting display device according to another exemplary embodiment of the present invention.

FIG. 7 is a cross-sectional view illustrating an organic light-emitting display device and method of fabricating the same according to another exemplary embodiment of the present invention. The organic light-emitting display device according to this exemplary embodiment may be identical to the organic light-emitting display device as shown in FIG. 3C, except for the differences described below. Moreover, the same reference numerals in FIG. 3C indicate the same components in FIG. 7.

Referring to FIG. 7, a reflective material layer is deposited on an entire surface of a substrate having source and drain electrodes 58-1 and 58-2. The deposited reflective material layer is patterned to form a reflective layer 61. The reflective layer 61 is formed to be spaced apart from the drain electrode 58-2 by a predetermined distance. At this time, an etching process may be either dry or wet etching.

Subsequently, a transparent conductive layer is deposited and then patterned on the drain electrode 58-2 and the reflective layer 61 to form a first electrode 62. The first electrode 62 is connected to the reflective layer 61 and the drain electrode 58-2 adjacent to the reflective layer 61.

However, in the organic light-emitting display device according to this exemplary embodiment, the source and drain electrodes 58-1 and 58-2 and the reflective layer 61 are formed in the same layer, namely, on an interlayer insulating layer 56. The first electrode 62 is in direct contact with the drain electrode 58-2, not through the via hole 59-1 of FIG. 3C, unlike the organic light-emitting display device shown in FIG. 3C.

Figure 8:
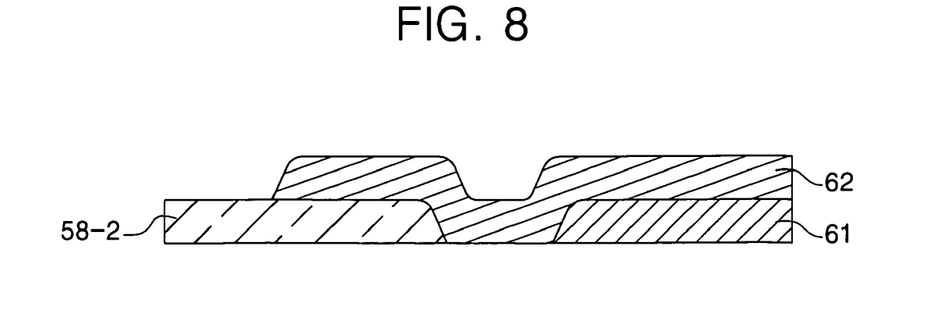
FIG. 8 is an enlarged cross-sectional view of the region D in FIG. 7.

FIG. 8 is an enlarged cross-sectional view of the region D in FIG. 7. Drain electrode 58-2, and a reflective layer 61 that is spaced apart from the drain electrode 58-2 by a predetermined distance, are formed on the same layer. The first electrode layer 62 is formed thereon, is visibly in contact with the drain electrode 58-2. As a result, the first electrode 62 is positioned on the drain electrode 58-2 to thereby be in electrical contact with the drain electrode 58-2, not through a contact hole, and to also cover both edges of the reflective layer 61.

As shown in the exemplary embodiments of the present invention, a drain electrode of a thin-film transistor is in direct and electrical contact with a first electrode or is electrically connected to the first electrode through a stable electrode pad so that stable contact resistance is achieved. Thus, the reflective properties of the display device, which was degraded due to conventional non-uniformity of contact resistance between the reflective layer and the transparent electrode layer, may be enhanced. As a result, the intensity of the outwardly emitted light increases such that the brightness of the organic light-emitting display device is enhanced. In addition, uniform brightness is achieved between respective pixels, resulting in high quality pictures.

As described above, although the organic light-emitting display device having the thin-film transistors of a top-gate structure has been described in the exemplary embodiments of the present invention, the present invention is also applicable to an organic light-emitting display device having thin-film transistors of a bottom-gate structure.

In addition, the organic light-emitting display device may realize a mono-color or full colors depending on the according to components of the organic functional layer, high reflectivity for any color, and a display with high brightness because there are no cross colors, or light attenuation and the like even though the light emitted from the emission layer is outputted to the second electrode through the reflective layer.

Hereinafter, the organic light-emitting display device according to the present invention will be described in connection with the following fabrication example. This fabrication example is only illustrative of the present invention and should not be construed as limiting the present invention.

FABRICATION EXAMPLE

In order to fabricate a top-emission organic light-emitting display device according to the present invention, a thin-film transistor including a semiconductor layer, a gate electrode, a source electrode and a drain electrode was formed by given semiconductor processes. Then, a two-layered passivation layer was formed on the source and drain electrodes. Next, an inorganic insulating layer of silicon nitride was formed over the entire surface of the substrate and then a predetermined region thereof was etched to form a first contact hole. Subsequently, benzocyclobutene (BCB), an organic insulating material, was deposited thereon to form an organic planarization layer. A predetermined region thereof was then etched to form a second contact hole connected to the first contact hole, thereby exposing the drain electrode. The source and drain electrodes were formed by sputtering molybdenum and tungsten.

An Al—Nd reflective material layer with a thickness of about 500 Å was then sputtered on to the passivation layer. Subsequently, in order to pattern the reflective material layer, the reflective material layer was coated with acrylic-based photoresist, and then a photolithography process including an exposure process and a developing process, and a subsequent dry etching process were performed, thus forming a reflective layer.

An ITO layer was then vacuum deposited over the entire surface of the substrate including the reflective layer to form a transparent conductive layer having a thickness of about 125 Å. Subsequently, in order to pattern the transparent conductive layer, the transparent conductive layer was coated with acrylic-based photoresist, and then a photolithography process including an exposure process and a developing process, and a subsequent dry etching process were performed, thus forming a first electrode.

A pixel defining layer was then formed on the first electrode and thereafter an opening with a certain region was formed by performing the same photolithography process previously described.

Next, IDE as a hole transport layer was vacuum deposited to a thickness of about 500 Å over the entire surface of the substrate including the first electrode under vacuum conditions. Under the same conditions, CBP+Ir (ppy)3 as an emission layer was then vacuum deposited to a thickness of about 250 Å, Alq3 as an electron transport layer was vacuum deposited to a thickness of about 450 Å, and LiF as an electron injection layer was vacuum deposited to a thickness of about 3 Å.

MgAg of 100 Å and IZO were then vacuum deposited to a thickness of about 1000 Å on the electron injection layer as a second electrode, and were encapsulated with a metal can, thereby fabricating the organic light-emitting device.

COMPARATIVE EXAMPLE

A top-emission organic light-emitting device was made by performing the same steps as in the experimental example except that a reflective layer and a first electrode were formed by placing a transparent conductive layer on the reflective material layer and then simultaneously patterning the transparent conductive layer and the reflective material layer, instead of performing a patterning process after forming the reflective material layer. That is, the first electrode was connected to a drain electrode through the reflective layer.

EXPERIMENTAL EXAMPLE

The contact resistance of the top-emission organic light-emitting display devices obtained from the fabrication example and the comparative example was measured, and their surface states were observed using a microscope. This result is shown in FIGS. 9 to 12.

Figure 9:
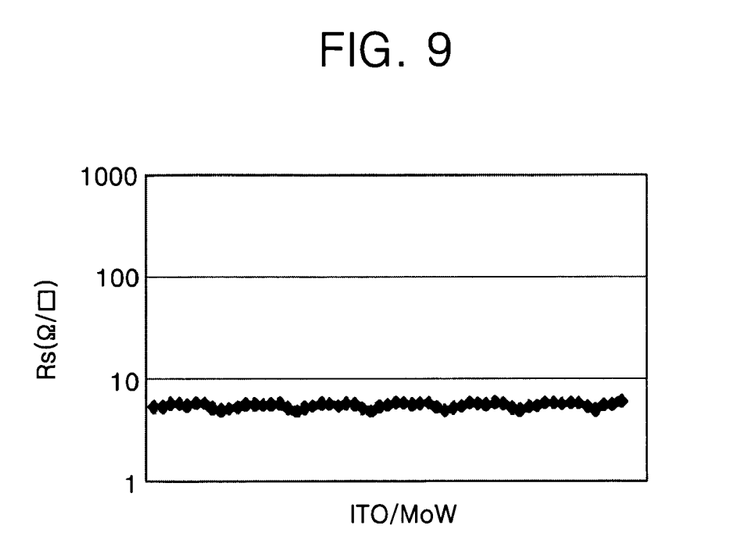
FIG. 9 is a graph showing a dispersion of contact resistance between a first electrode and source or drain electrodes of an organic light-emitting display device according to a fabrication example of the present invention.
Figure 10:
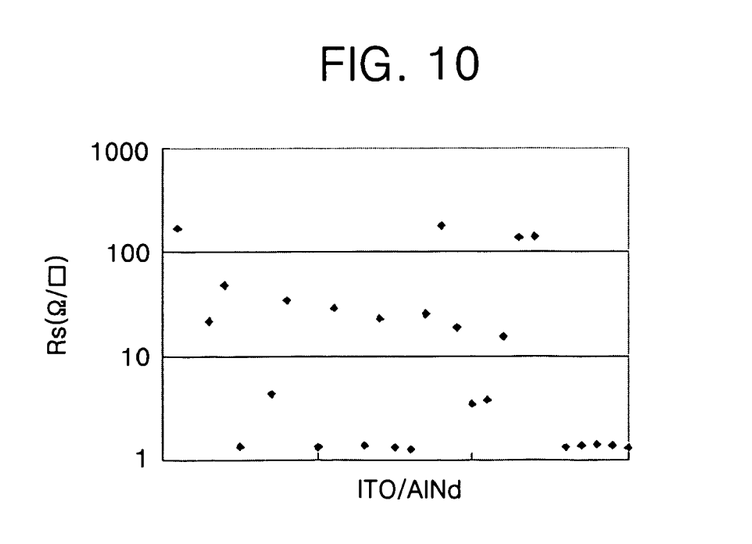
FIG. 10 is a graph showing a dispersion of contact resistance between a first electrode and source or drain electrodes of an organic light-emitting display device according to a comparative example of the present invention.

FIG. 9 is a graph obtained by measuring the contact resistance in the interface between the drain electrode and the first electrode (MoW and ITO) of the top-emission organic light-emitting display device obtained in the fabrication example. FIG. 10 is a graph obtained by measuring the contact resistance in the interfaces between the drain electrode, the reflective layer and the first electrode (MoW, AlNd and ITO) of the top-emission organic light-emitting display device obtained in the comparative example.

Referring to FIG. 9, numerical values of the contact resistance measured in several regions of the organic light-emitting display device are substantially similar to one another. This shows that the contact resistance between the drain electrode and the first electrode is highly stable. On the other hand, referring to FIG. 10, it can be seen that the numerical values of the contact resistance vary greatly. It shows that the contact resistance between the drain electrode and the first electrode is very unstable. This unstable contact resistance is caused by an aluminum oxide ($Al_2O_3$) layer formed in the interface between the Al—Nd layer used as the reflective layer and the ITO layer used as the first electrode.

Figure 11:
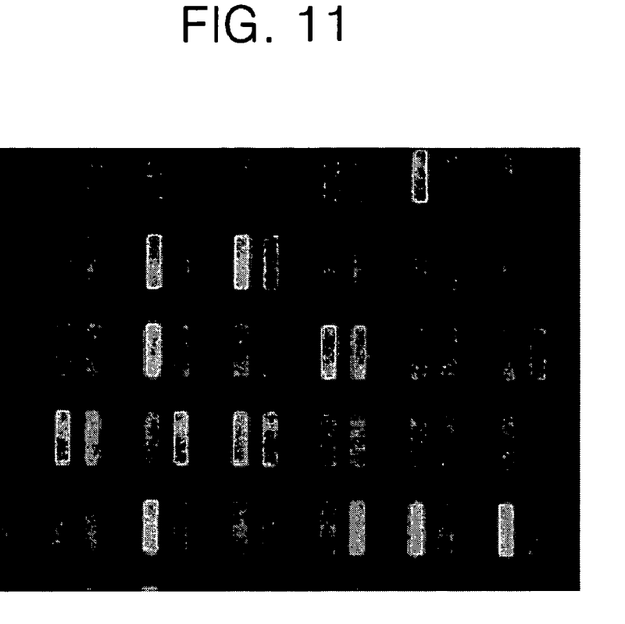
FIG. 11 is a photograph showing unit pixels that emit light when an organic light-emitting display device is driven according to an experimental example of the present invention.
Figure 12:
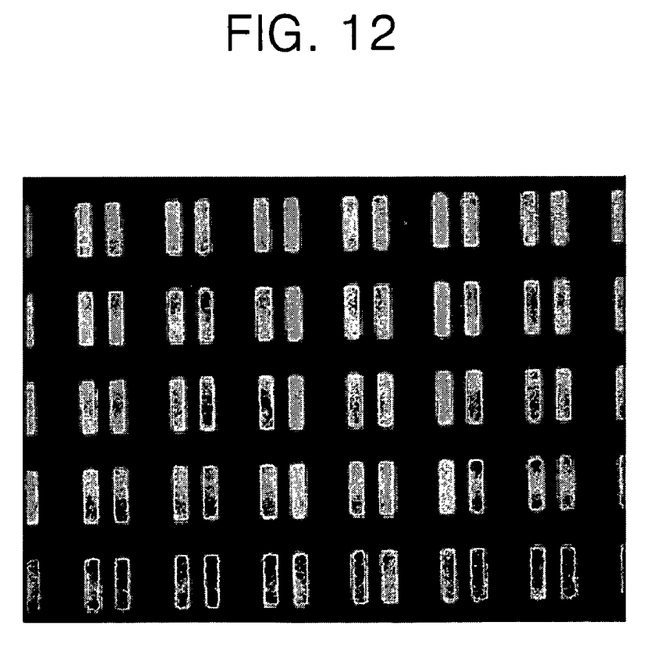
FIG. 12 is a photograph showing unit pixels that emit light when an organic light-emitting display device is driven according to a comparative example of the present invention.

This dispersion of the contact resistance directly affects the brightness of the top-emission organic light-emitting display device, as seen in FIGS. 11 and 12.

FIG. 11 is a photograph that shows then surface state in each pixel in operating the top-emission organic light-emitting display device obtained in the fabrication example. FIG. 12 is a photograph showing the surface state in each pixel in operating the top-emission organic light-emitting display device obtained in the comparative example.

Referring to FIG. 11, it can be seen that the top-emission organic light-emitting display device according to the fabrication example exhibits uniform brightness in the respective pixels since the resistance between a drain electrode and a first electrode is uniform. On the other hand, referring to FIG. 12, the device according to the comparative example has very non-uniform brightness that is lower than that of FIG. 11, in which some of the pixels of the top-emission organic light-emitting display device are dark while the others are bright.

Consequently, it is shown that, problems such as the brightness non-uniformity between the pixels shown in FIG. 12 are solved by allowing one of the source or drain electrodes of the thin-film transistor to be in direct contact with the first electrode layer according to the present invention.

As described above, the top-emission organic light-emitting display device was fabricated either the source or drain electrodes of the thin-film transistor is in direct contact with the first electrode, and the reflective layer for realizing the top-emission is positioned below the first electrode to be spaced apart from the source and drain electrodes.

The top-emission organic light-emitting display according to the present invention may achieve uniform contact resistance between the drain electrode and the first electrode. As a result, the top-emission organic light-emitting display device achieved by the present invention may realize high definition screens because brightness between respective pixels is uniform.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light-emitting display device, comprising:
a thin-film transistor positioned on a substrate; and
an organic light-emitting diode;
wherein the thin-film transistor includes a semiconductor layer, a gate electrode, a source electrode and a drain electrode,
wherein the organic light-emitting diode includes an electrode pad that is in contact with the source electrode or the drain electrode, a first electrode positioned on and being in contact with the electrode pad, a reflective layer interposed between and contacting the electrode pad and the first electrode, an organic functional layer positioned on the first electrode, the organic functional layer having at least an emission layer, and a second electrode positioned on the organic functional layer,
wherein the first electrode covers both edges of the reflective layer, and
wherein the electrode pad and the first electrode are formed of a same material.

2. The device according to claim 1, wherein the reflective layer only contacts the electrode pad and the first electrode.

3. An organic light-emitting display device, comprising:
a thin-film transistor positioned on a substrate;
a passivation layer positioned on the thin-film transistor and having a via hole; and
an organic light-emitting diode,
wherein the thin-film transistor comprises a semiconductor layer, a gate electrode, a source electrode and a drain electrode,
wherein the organic light emitting diode comprises a first electrode coupled to one of the source electrode and the drain electrode via the via hole, the first electrode being positioned in the via hole, a reflective layer positioned below the first electrode and spaced apart from the source electrode and the drain electrode, an organic functional layer positioned on the first electrode, the organic functional layer having at least an emission layer, and a second electrode positioned on the organic functional layer,
wherein the organic light-emitting display device further comprises an electrode pad directly connected to at least a portion of the first electrode and to the one of the source electrode and the drain electrode, the electrode pad being interposed between the first electrode and the one of the source electrode and the drain electrode,
wherein the electrode pad contacts the reflective layer, and
wherein the electrode pad and the first electrode are formed of a same material.

4. The device according to claim 3, wherein the reflective layer only contacts the electrode pad and the first electrode.

5. The device according to claim 3, wherein the first electrode does not contact the passivation layer.

6. An organic light-emitting display device, comprising:
an insulating substrate;
a semiconductor layer positioned on the insulating substrate;
a gate insulating layer positioned on the semiconductor layer;
a gate electrode positioned on the gate insulating layer;
an interlayer insulating layer positioned on the gate electrode;
a source electrode and a drain electrode positioned on the interlayer insulating layer, the source electrode and the drain electrode being in contact with a top surface of the interlayer insulating layer;
a reflective layer directly positioned on the top surface of the interlayer insulating layer and spaced apart from the source electrode and the drain electrode, the reflective layer having an oxide layer;
a first electrode positioned on the reflective layer and directly connected to either the source electrode or the drain electrode, the first electrode being in contact with the reflective layer and covering both edges of the reflective layer;

an organic functional layer positioned on the first electrode, the organic functional layer having at least an emission layer; and a second electrode positioned on the organic function layer, wherein the reflective layer, the source electrode and the drain electrode are formed on a same layer.

7. The device according to claim 6, wherein the source electrode and the drain electrode comprise molybdenum (Mo) layers or molybdenum-tungsten alloy (MoW) layers.

8. The device according to claim 6, wherein the reflective layer is either an aluminum (Al) layer or an aluminum-neodymium (Al-Nd) layer.

9. The device according to claim 6, wherein the reflective layer is about 100 Å to about 2000 Å thick.

10. The device according to claim 6, wherein the first electrode is a transparent conductive layer.

11. The device according to claim 10, wherein the transparent conductive layer is an indium tin oxide (ITO) layer or an indium zinc oxide (IZO) layer.

12. The device according to claim 6, wherein the first electrode is about 50 Å to about 700 Å thick.

13. The device according to claim 6, wherein the organic functional layer further includes at least one selected from a group consisting of a hole injection layer, a hole transport layer, a hole blocking layer, an electron transport layer, and an electron injection layer.

14. The device according to claim 6, wherein the second electrode is formed of one material selected from a group consisting of ITO, IZO, Mg, Ca, Al, Ag, Ba and an alloy thereof.

15. The device according to claim 6, wherein either the first electrode or the second electrode is an anode.

16. The device according to claim 6, wherein a portion of the first electrode is arranged directly between the reflective layer and either the source electrode or the drain electrode.

17. The device according to claim 6, wherein the first electrode contacts the interlayer insulating layer.

* * * * *